United States Patent
Lee et al.

(10) Patent No.: US 7,324,345 B2
(45) Date of Patent: Jan. 29, 2008

(54) ELECTRONIC DEVICE WITH HEAT-DISSIPATION STRUCTURE

(75) Inventors: Kuo-Liang Lee, Taoyuan (TW); Wen-Ching Wu, Taoyuan (TW); Jui-Yuan Hsu, Taoyuan (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 52 days.

(21) Appl. No.: 11/287,023

(22) Filed: Nov. 23, 2005

(65) Prior Publication Data
US 2006/0109634 A1   May 25, 2006

(30) Foreign Application Priority Data
Nov. 24, 2004 (TW) ............................... 93136161 A

(51) Int. Cl.
*H05K 7/20* (2006.01)

(52) U.S. Cl. .................................................... 361/719

(58) Field of Classification Search ................ 361/719, 361/721, 714, 715, 796; 174/16.1, 16.3; 165/80.2, 80.3
See application file for complete search history.

(56) References Cited

U.S. PATENT DOCUMENTS 4,122,508 A * 10/1978 Rumbaugh .................. 361/697

\* cited by examiner

*Primary Examiner*—Javaid H. Nasri

(57) ABSTRACT

An electronic device with a heat-dissipation structure is disclosed. The electronic device comprises a housing, a printed circuit board assembly, and a heat sink. The printed circuit board assembly is disposed in an interior of the housing, and the printed circuit board assembly forms a high-temperatured heat flow area and a low-temperatured heat flow area in the electronic device. The heat sink is disposed between the printed circuit board assembly and the housing and in the low-temperatured heat flow area for balancing heat flow and homogenizing temperature of the electronic device to enhance heat-dissipation efficiency.

20 Claims, 3 Drawing Sheets

ELECTRONIC DEVICE WITH HEAT-DISSIPATION STRUCTURE

FIELD OF THE INVENTION

The present invention relates to an electronic device, and more particularly to an electronic device with a heat-dissipation structure.

BACKGROUND OF THE INVENTION

The portable electronic products or other electronic information products, such as the personal notebook or personal digital assistant, become indispensable electronic products in daily life. Since these electronic products are carried with the user usually, the adapter, power supply and charger are necessary accessories to keep enough power of the electronic products.

Take the adapter as an example. When the adapter is under operation, partial electric power will be consumed. With the technical progress of the electronic product and in response to the requirement of the user, more and more electronic components are loaded on the printed circuit board in the interior of the electronic product, which increases the integration of the electronic components. Therefore, the electric power consumption for the operation of most adapters is increased to 100 to 200 watts, or more than 200 watts. As the watt consumption increases, more and more heat is generated, resulting in the increase of the temperature of the whole adapter.

Please refer to FIG. 1, which is a cross-sectional view showing the structure of the conventional adapter. The adapter 1 comprises a printed circuit board (PCB) assembly 11 and a housing 12. The PCB assembly 11 comprises a printed circuit board (PCB) 13 and a plurality of electronic components 14, and is covered by a metal cover 15. When the adapter 1 is connected between the electronic product and the commercial power source and under operation, the heat generated from the electronic components 14 in the PCB assembly 11 is conducted all around, so the metal cover 15 can conduct the heat to the housing 12 to be dissipated.

The housing 12 of the adapter 1 is composed of upper and lower housings 121 and 122. Since a draft angle $\phi$ is formed to facilitate drafting during the plastic demolding process as manufacturing the upper and lower housings 121 and 122, a concave surface is formed on the inner side surface of the housing 12 after the upper and lower housings 121 and 122 are assembled, which results in that the inner side surface of the housing 12 and the vertical side surface of the PCB assembly 11 cannot conform to and stay close to each other and a space 16 is formed therebetween.

When the heat is generated from the electronic components 14, the heat flow will be toward to the area having lower thermal resistance. Since the space 16 is formed between the inner side surface of the housing 12 and the vertical side surface of the PCB assembly 11 and the thermal conductivity of the air filled in the space 16 is much lower than that of the metal cover 15 close to the top of the housing 12, the thermal resistance at the side areas of the housing 12 is higher than that at the top area of the housing 12. Therefore, the heat flow flows to the top area of the housing 12 in a major proportion, and thus, the temperature at the top surface is higher than those at the side surfaces of the adapter 1. Further, the formation of the space 16 will decrease the heat-dissipation efficiency.

Ununiform temperature distribution of the adapter 1 will cause the over-temperature of the high-temperatured heat flow area. When the high-temperatured heat flow area is close to the important electronic components on the printed circuit board, the adapter 1 will be broken easily or its lifespan will be shortened due to the over-temperature condition, and even more, a fire accident may occur. Therefore, it is needed to provide an electronic device with a heat-dissipation structure to overcome the above defects of the prior art.

SUMMARY OF THE INVENTION

An object of the present invention is to provide an electronic device with a heat-dissipation structure to overcome the defects of poor heat-dissipation efficiency and ununiform temperature distribution of the conventional electronic device due to the high thermal resistance of the space formed between the inner side of the housing and the side of the printed circuit board assembly.

According to an aspect of the present invention, there is provided an electronic device with a heat-dissipation structure. The electronic device comprises a housing, a printed circuit board assembly, and a heat sink. The printed circuit board assembly is disposed in an interior of the housing, and the printed circuit board assembly forms a high-temperatured heat flow area and a low-temperatured heat flow area in the electronic device. The heat sink is disposed between the printed circuit board assembly and the housing and in the low-temperatured heat flow area for balancing heat flow and homogenizing temperature of the electronic device to enhance heat-dissipation efficiency In an embodiment, the electronic device is an adaptor, a power supply or a charger.

In an embodiment, the housing comprises an upper housing and a lower housing.

In an embodiment, the printed circuit board assembly comprises a printed circuit board, a plurality of electronic components and a metal cover.

In an embodiment, the heat sink is integrally formed with the metal cover of the printed circuit board assembly. Alternatively, the heat sink is independent from the metal cover of the printed circuit board assembly.

In an embodiment, the high-temperatured heat flow area is located between a top of the printed circuit board assembly and a top of the housing.

In an embodiment, the low-temperatured heat flow area is located between a side of the printed circuit board assembly and an inner side of the housing.

In an embodiment, a space is formed between the side of the printed circuit board assembly and the inner side of the housing, and the heat sink is disposed in the space.

In an embodiment, the inner side of the housing has a concave surface.

In an embodiment, the heat sink comprises a first surface and a second surface, the first surface substantially being a plane and the second surface substantially being a convex surface protruding outwardly.

In an embodiment, the first surface and the second surface stay close to the side of the printed circuit board assembly and the inner side of the housing, respectively.

In an embodiment, the heat sink is made of a metal material.

According to another aspect of the present invention, there is provided an electronic device with a heat-dissipation structure. The electronic device comprises a housing, a printed circuit board assembly, and a heat sink. The printed circuit board assembly is disposed in an interior of the housing, and having a side forming a space with the inner side of the housing therebetween. The heat sink is disposed in the space formed between the printed circuit board assembly and the housing for balancing heat flow and homogenizing temperature of the electronic device to enhance heat-dissipation efficiency.

In an embodiment, the electronic device is an adaptor, a power supply or a charger.

In an embodiment, the housing comprises an upper housing and a lower housing.

In an embodiment, the printed circuit board assembly comprises a printed circuit board, a plurality of electronic components and a metal cover.

In an embodiment, the heat sink is integrally formed with the metal cover of the printed circuit board assembly. Alternatively, the heat sink is independent from the metal cover of the printed circuit board assembly.

In an embodiment, the heat sink comprises a first surface and a second surface staying close to the side of the printed circuit board assembly and the inner side of the housing, respectively.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The present invention relates to an electronic device with a heat-dissipation structure. The present techniques are illustrated with the following embodiments for an adapter, but the electronic device that is applicable to the present techniques is not limited to the adapter. Any electronic device, such as a power supply or a charger, which is applicable to the following techniques, is incorporated herein for reference.

Figure 1:
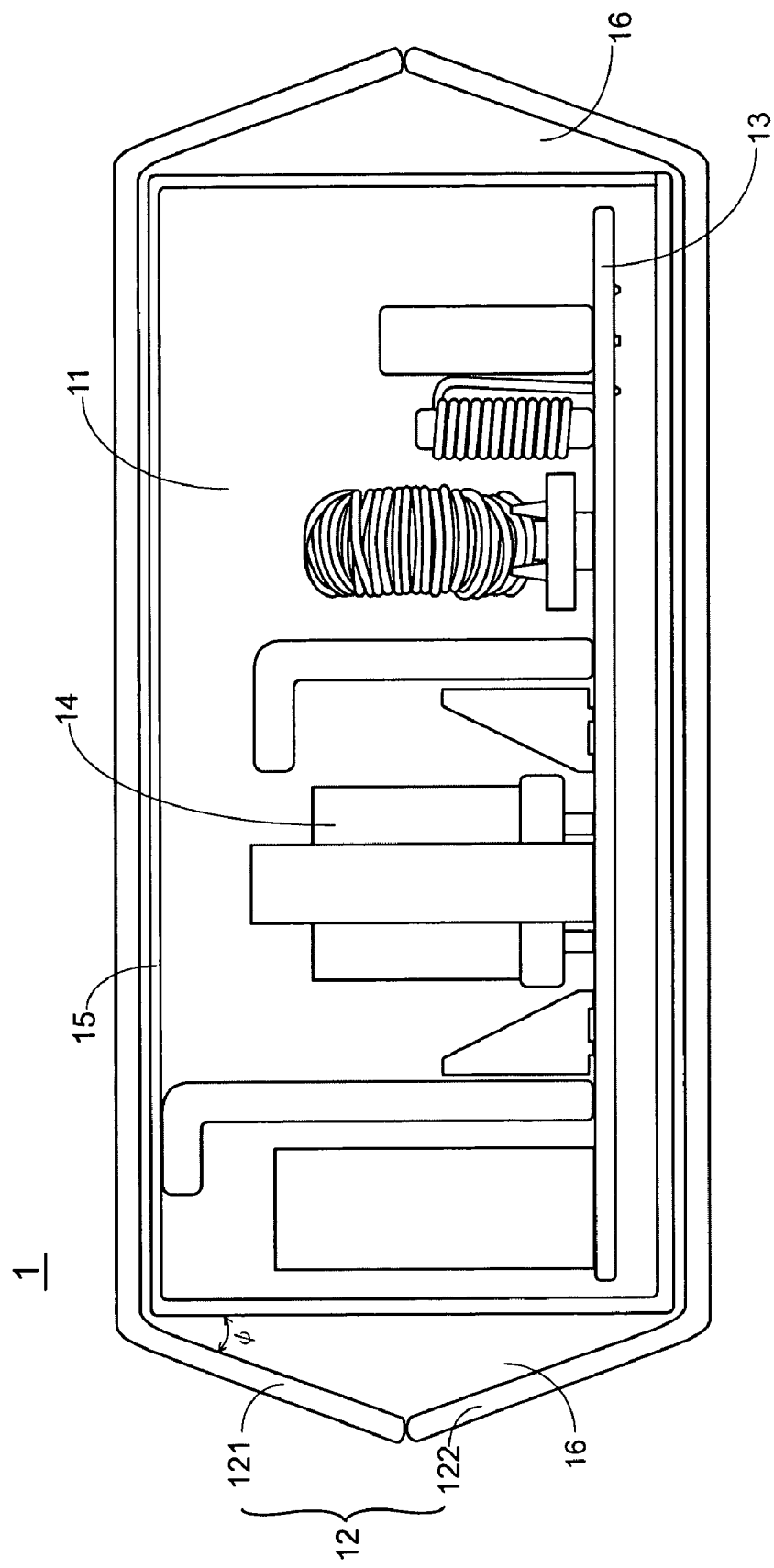
FIG. 1 is a cross-sectional view showing the structure of the conventional adapter.
Figure 2:
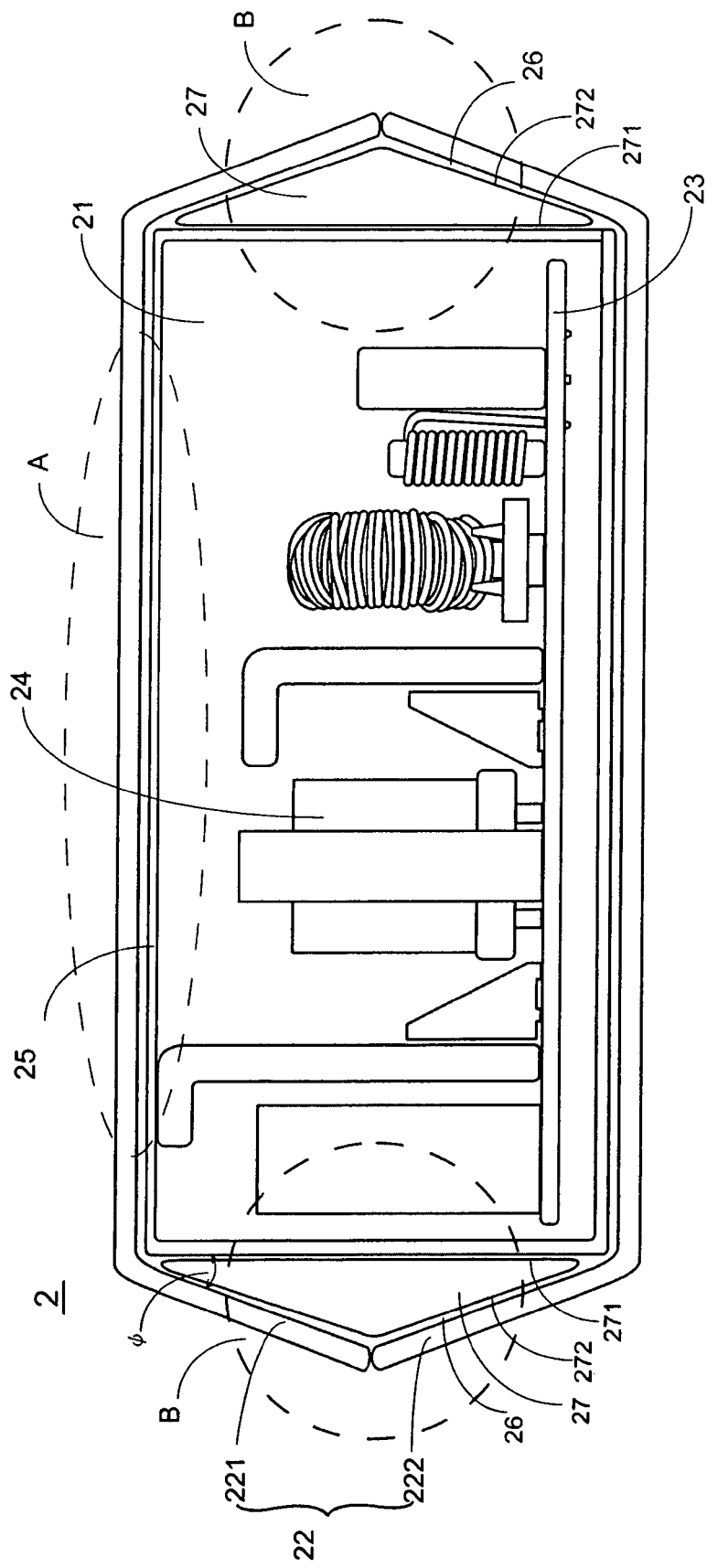
FIG. 2 is a cross-sectional view showing the electronic device with a heat-dissipation structure according to a preferred embodiment of the present invention.

Please refer to FIG. 2, which is a cross-sectional view showing the electronic device with a heat-dissipation structure according to a preferred embodiment of the present invention. As shown in FIG. 2, the electronic device is an adapter 2, which comprises a printed circuit board (PCB) assembly 21, a housing 22 and a heat sink 27. The PCB assembly 21 is disposed in the interior of the housing 22, and the heat sink 27 is disposed between the PCB assembly 21 and the housing 22.

The PCB assembly 21 comprises a printed circuit board (PCB) 23 and a plurality of electronic components 24, and is covered by a metal cover 25. The metal cover 25 is formed by bending a metal plate, and an insulating piece (not shown) can be additionally disposed on the metal cover 25. When the adapter 2 is connected between the electronic product and the commercial power source and under operation, the heat generated from the electronic components 24 in the PCB assembly 21 is conducted all around, so the metal cover 15 can conduct the heat to the housing 22 to be dissipated. In addition, since the top of the metal cover 25 substantially stays close to the top of the housing 22, the thermal resistance in this area is relatively low, and thus, the area between the top of the PCB assembly 21 and the top of the housing 22 is defined as a high-temperatured heat flow area A. On the other hand, since the side of the metal cover 25 does not stay close to the inner side of the housing 22, the thermal resistance in this area is relatively high, and thus, the area between the side of the PCB assembly 21 and the side of the housing 22 is defined as a low-temperatured heat flow area B.

In this embodiment, the housing 22 of the adapter 2 is composed of upper and lower housings 221 and 222. Since a draft angle φ is formed to facilitate drafting during the plastic demolding process as manufacturing the upper and lower housings 221 and 222, a concave surface is formed on the inner side surface of the housing 22 after the upper and lower housings 221 and 222 are assembled, and a space 26 is formed between the inner side surface of the housing 22 and the vertical side surface of the PCB assembly 21. The heat sink 27 is made of a metal material with high thermal conductivity, and is disposed in the space between the vertical side surface of the PCB assembly 21 and the inner side surface of the housing 22, i.e. the low-temperatured heat flow area B of the adapter 2, so as to reduce the thermal resistance in the space 26, increase the flow proportion of the heat flow flowing through this area to balance the heat flow, and enhance the heat-dissipation efficiency.

The heat sink 27 has a first surface 271 and a second surface 272, wherein the first surface 271 is substantially a plane, and the second surface 272 is a convex surface protruding outwardly. When the heat sink 27 is disposed in the space 26, the first surface 271 and the second surface 272 stay close to the vertical side surface of the PCB assembly 21 and the inner side surface of the housing 22, respectively. Therefore, the heat sink 27 with high thermal conductivity replaces the air with low thermal conductivity in the space 26, which reduces the thermal resistance in the space 26, increases the flow proportion of the heat flow flowing toward the sides of the adapter 2, and enhances the heat-dissipation efficiency of the adapter 2. Certainly, the profiles of the first surface 271 and the second surface 272 of the heat sink 27 are not limited, and other profiles that can stay close to the vertical side surface of the PCB assembly 21 and the inner side surface of the housing 22 are incorporated herein for reference.

Generally speaking, the heat generated from the electronic components 24 on the PCB assembly 21 of the adapter 2 will flow toward the area with lower thermal resistance. According to the present design, the heat sink 27 with high thermal conductivity is disposed in the space 26 formed between the vertical side surface of the PCB assembly 21 and the inner side surface of the housing 22 to replace the air with low thermal conductivity, so that the thermal resistance in the original low-temperatured heat flow area B can be reduced. Therefore, the heat can be uniformly transferred to the housing 22 to be dissipated both through the top and the side areas, so as to homogenize the temperature of the adapter 2 and enhance the heat-dissipation efficiency.

Figure 3:
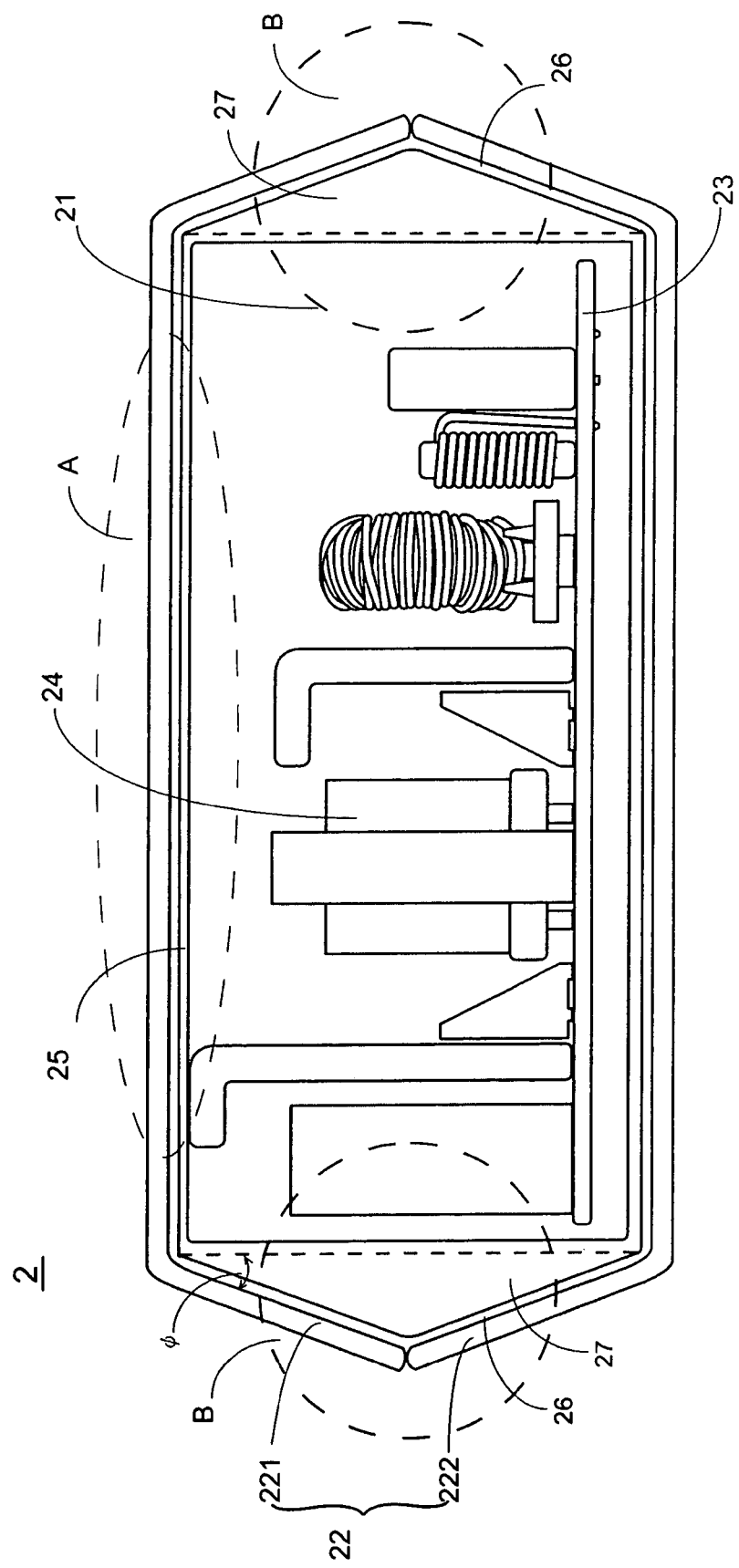
FIG. 3 is a cross-sectional view showing the electronic device with a heat-dissipation structure according to another preferred embodiment of the present invention.

Please refer to FIG. 3. In some embodiments, the heat sink 27 is integrally formed with the metal cover 25 of the PCB assembly 21. In some other embodiments, the heat sink 27 is independent from the metal cover 25 of the PCB assembly 21. In addition, the electronic device can be a power supply or a charger, but not limited thereto.

In conclusion, the electronic device with a heat-dissipation structure of the present invention is characterized by that a heat sink is disposed in the space formed between the inner side surface of the housing and the vertical side surface of the PCB assembly. Thereby, the air with low thermal conductivity originally filled in the space is replaced by the heat sink with high thermal conductivity, so as to reduce the thermal resistance in the space, increase the flow proportion of the heat flow flowing through the sides of the adapter, and enhance the heat-dissipation efficiency. Moreover, the heat flow originally flows to the top of the housing will partially transferred to the sides of the housing, so that the temperature of the electronic device can be homogenized, and the temperature of the electronic components in the interior of the electronic device will not exceed the safety standard due to over-temperature condition in local to avoid the electronic device from breakdown and the lifespan thereof to be shortened. Therefore, the electronic device with a heat-dissipation structure of the present invention possesses high industrial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic device with a heat-dissipation structure, comprising:
    a housing;
    a printed circuit board assembly disposed in an interior of said housing, said printed circuit board assembly forming a high-temperatured heat flow area and a low-temperatured heat flow area in said electronic device; and
    a heat sink disposed between said printed circuit board assembly and said housing and in said low-temperatured heat flow area for balancing heat flow and homogenizing temperature of said electronic device to enhance heat-dissipation efficiency;
    whereby heat of said electronic device is dissipated via passive cooling.

2. The electronic device with a heat-dissipation structure according to claim 1 wherein said electronic device is an adaptor, a power supply or a charger.

3. The electronic device with a heat-dissipation structure according to claim 1 wherein said housing comprises an upper housing and a lower housing.

4. The electronic device with a heat-dissipation structure according to claim 1 wherein said printed circuit board assembly comprises a printed circuit board, a plurality of electronic components and a metal cover.

5. The electronic device with a heat-dissipation structure according to claim 4 wherein said heat sink is integrally formed with said metal cover of said printed circuit board assembly.

6. The electronic device with a heat-dissipation structure according to claim 4 wherein said heat sink is independent from said metal cover of said printed circuit board assembly.

7. The electronic device with a heat-dissipation structure according to claim 1 wherein said high-temperatured heat flow area is located between a top of said printed circuit board assembly and a top of said housing.

8. The electronic device with a heat-dissipation structure according to claim 1 wherein said low-temperatured heat flow area is located between a side of said printed circuit board assembly and an inner side of said housing.

9. The electronic device with a heat-dissipation structure according to claim 8 wherein a space is formed between said side of said printed circuit board assembly and said inner side of said housing, and said heat sink is disposed in said space.

10. The electronic device with a heat-dissipation structure according to claim 9 wherein said inner side of said housing has a concave surface.

11. The electronic device with a heat-dissipation structure according to claim 10 wherein said heat sink comprises a first surface and a second surface, said first surface substantially being a plane and said second surface substantially being a convex surface protruding outwardly.

12. The electronic device with a heat-dissipation structure according to claim 11 wherein said first surface and said second surface stay close to said side of said printed circuit board assembly and said inner side of said housing, respectively.

13. The electronic device with a heat-dissipation structure according to claim 1 wherein said heat sink is made of a metal material.

14. An electronic device with a heat-dissipation structure, comprising:
    a housing having an inner side;
    a printed circuit board assembly disposed in an interior of said housing, and having a side forming a space with said inner side of said housing therebetween; and
    a heat sink disposed in said space formed between said printed circuit board assembly and said housing for balancing heat flow and homogenizing temperature of said electronic device to enhance heat-dissipation efficiency;
    whereby heat of said electronic device is dissipated via passive cooling.

15. The electronic device with a heat-dissipation structure according to claim 14 wherein said electronic device is an adaptor, a power supply or a charger.

16. The electronic device with a heat-dissipation structure according to claim 14 wherein said housing comprises an upper housing and a lower housing.

17. The electronic device with a heat-dissipation structure according to claim 14 wherein said printed circuit board assembly comprises a printed circuit board, a plurality of electronic components and a metal cover.

18. The electronic device with a heat-dissipation structure according to claim 17 wherein said heat sink is integrally formed with said metal cover of said printed circuit board assembly.

19. The electronic device with a heat-dissipation structure according to claim 17 wherein said heat sink is independent from said metal cover of said printed circuit board assembly.

20. The electronic device with a heat-dissipation structure according to claim 14 wherein said heat sink comprises a first surface and a second surface staying close to said side of said printed circuit board assembly and said inner side of said housing, respectively.

* * * * *